(12) United States Patent
White et al.

(10) Patent No.: US 6,184,696 B1
(45) Date of Patent: Feb. 6, 2001

(54) USE OF CONVERGING BEAMS FOR TRANSMITTING ELECTROMAGNETIC ENERGY TO POWER DEVICES FOR DIE TESTING

(75) Inventors: Stanley A. White, San Clemente; Kenneth S. Walley, Portola Hills; James W. Johnston, Rancho Santa Margarita; P. Michael Henderson, Tustin; Kelly H. Hale, Aliso Viejo, all of CA (US); Warner B. Andrews, Jr., Boulder, CO (US); Jonathan I. Siann, San Diego, CA (US)

(73) Assignee: Conexant Systems, Inc., Newport Beach, CA (US)

( * ) Notice: Under 35 U.S.C. 154(b), the term of this patent shall be extended for 0 days.

(21) Appl. No.: 09/046,010

(22) Filed: Mar. 23, 1998

(51) Int. Cl.$^7$ .................................................. G01R 31/302
(52) U.S. Cl. .............................. 324/750; 250/310
(58) Field of Search .................... 324/750, 751, 324/158.1; 250/310, 311, 492.2

(56) References Cited

U.S. PATENT DOCUMENTS

| | | | |
|---|---|---|---|
| 4,851,768 | * 7/1989 | Yoshizawa et al. | 324/751 |
| 5,006,795 | * 4/1991 | Yoshizawa et al. | 324/751 |
| 5,093,572 | * 3/1992 | Hosono | 250/310 |
| 5,576,542 | * 11/1996 | Kaga | 250/310 |
| 5,892,224 | * 4/1999 | Nakasuji | 250/310 |

FOREIGN PATENT DOCUMENTS 04343245  11/1992 (JP).

* cited by examiner

*Primary Examiner*—Safet Metjahic
*Assistant Examiner*—Minh Tang
(74) *Attorney, Agent, or Firm*—Snell & Wilmer L.L.P.

(57) ABSTRACT

The described method and apparatus wirelessly test individual integrated circuit die on a wafer containing multiple die. The method incorporates activating a selected die on the wafer by wirelessly impacting the die with at least two beams of electromagnetic radiation so that the die receives radiation energy having at least a first energy level, thereby activating the die by causing a current to flow in the die. Each beam of electromagnetic energy individually has less than the first energy level required to activate the die. The beams of electromagnetic energy are directed so that they at least partially overlap on the selected die. In the region of overlap, the two beams together impact the die with an energy level at least equal to the first energy level required to activate the die. The method may additionally include detecting electromagnetic radiation emitted by the die in response to the electromagnetic energy received from the beams of electromagnetic energy. The apparatus includes an integrated circuit wafer and test apparatus. The integrated circuit wafer contains a plurality of individual die. Each die can be activated by directing electromagnetic energy having at least a first energy level onto that die. The test apparatus includes first and second sources of electromagnetic energy. Each source directs to a selected die on the wafer a beam of electromagnetic energy having an energy level less than the first energy level. The beams at least partially overlap on the selected die so that together they couple to the die energy of at least the first energy level.

6 Claims, 11 Drawing Sheets

USE OF CONVERGING BEAMS FOR TRANSMITTING ELECTROMAGNETIC ENERGY TO POWER DEVICES FOR DIE TESTING

CROSS-REFERENCE TO RELATED APPLICATIONS

Not applicable.

FEDERALLY SPONSORED RESEARCH

Not applicable.

BACKGROUND OF THE INVENTION

The present invention relates to testing individual integrated circuits. In particular, the present invention relates to selectively testing individual chips on a wafer containing multiple chips.

Integrated circuits, and in particular semiconductor integrated circuits, are manufactured by fabricating several individual die or chips on a wafer. The die on a single wafer are typically identical. After fabrication, the wafer is cut up into the individual die. The process of cutting or sawing the wafer into the individual die is called "dicing" the wafer. After the wafer is diced, the individual die are then packaged.

Before the wafer is cut into the individual die, the manufacturer may desire to test the individual die. Such testing permits the manufacturer to discard non-functional die prior to incurring the expense of packaging such defective die.

Typically the individual die are tested by contacting each die on the wafer with a probe device. The probe device contacts test contact pads fabricated on each die, activates the circuitry on the die, and executes a test of the chip. The die failing the test are marked, and are discarded after the wafer is diced.

The current testing methods require that physical probes must be designed and prepared for each different die design, as the points at which the probes must contact the die are different for each die design. The different designs additionally require that the chip tester be physically reconfigured each time a different die design is to be tested.

SUMMARY OF THE INVENTION

The present invention is a method of, and apparatus for, wirelessly testing individual die on a wafer containing multiple individual die or integrated circuits.

The method of testing incorporates selectively activating a selected die on the wafer. The die may be activated by being impacted by electromagnetic radiation having at least a first predetermined energy level. The method of activating the selected die includes directing first and second beams of electromagnetic energy toward the die. Each of the first and second beams of electromagnetic energy individually has less than the first energy level required to activate the die. The method further includes directing the first and second beams of the electromagnetic energy so that they overlap on the first die. The first and second beams overlap on the first die in a region of overlap. In the region of overlap, the first and second beams impact the die with an energy level greater than the first energy level required to activate the die.

The method may additionally include detecting electromagnetic radiation radiated by the die when the die is activated by the energy of the first and second beams of electromagnetic energy.

An apparatus for testing integrated circuit die includes a first source of electromagnetic energy for generating a first beam of electromagnetic energy, and a first deflector for the directing the first beam toward the integrated circuit die to be tested. The test apparatus additionally includes a second source of electromagnetic energy for generating a second beam of electromagnetic energy and a second deflector for directing the second beam toward the integrated circuit die, so that the second beam overlaps the first beam on the integrated circuit die. The test apparatus additionally includes a detector for detecting electromagnetic radiation emitted by the integrated circuit die.

DETAILED DESCRIPTION OF A PREFERRED EMBODIMENT

Semiconductor integrated circuits are typically formed by fabricating a wafer containing several individual integrated circuits, or die. Typically, all the die on a single wafer are identical.

Figure 1:
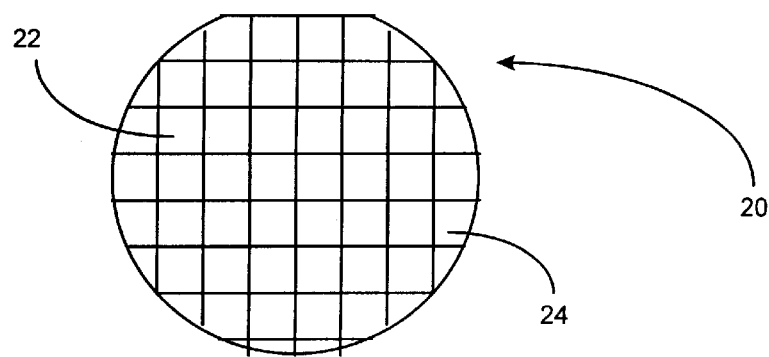
FIG. 1 illustrates a semiconductor wafer containing a plurality of individual die that may be tested in accordance with the present invention.

A representative wafer 20 containing several individual die is shown in FIG. 1. A particular die 22 is identified. The die 22 is designed and fabricated in accordance with an aspect of the present invention, as described below. All the other die on the wafer 20 are identical to the die 22. The wafer 20 may contain some partial die 24 at the edges of the wafer 20. Many techniques for fabricating such wafers are generally known and available in the semiconductor manufacturing arts.

After the wafer 20 is fabricated, preliminary testing is performed on the individual die 22 of the wafer in accordance with the present invention. After such testing, the individual die 22 are sawed apart, or diced. The process of dicing semiconductor wafers into the individual die is well understood in the art. Each separate individual die 22 may then be packaged using any of the conventionally available packaging techniques.

Figure 2:
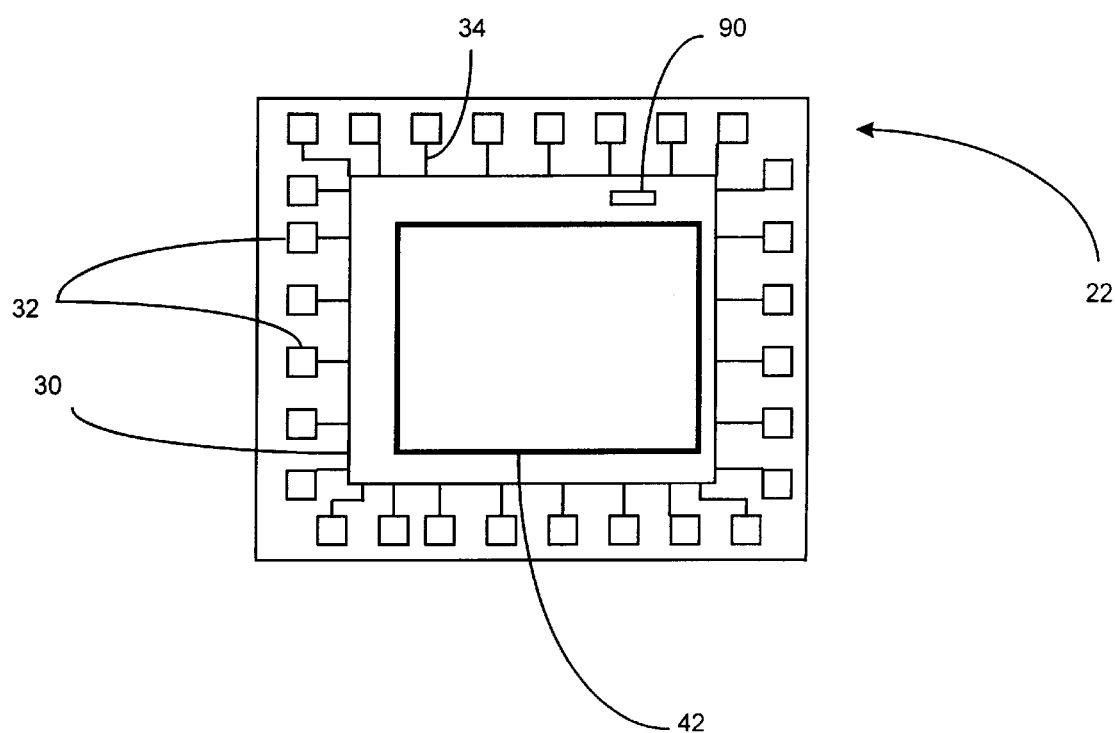
FIG. 2 is a representation of the layout of an individual die of the wafer shown in FIG. 1.

A representation of one embodiment of the individual die 22 is shown in FIG. 2. The die 22 includes primary circuitry 30 surrounded by a plurality of contact pads 32. When packaging the die, the contact pads 32 are the points at which the wires of the package pins contact the circuitry on the die. Each contact pad 32 is connected to the primary die circuitry 30 by a conductive trace or lead 34.

The contact pads 32 may also be used in testing the die, either while the die 22 is still part of the wafer 20, or after the wafer 20 is diced into the individual die. Test probes may be brought into contact with appropriate ones of the contact pads 32 to activate the circuitry 30, and to check for particular responses from the circuitry.

In accordance with the present invention, the individual die may also be activated wirelessly, without physical contact between a test probe and the die. In accordance with an aspect of the present invention, the individual die 22 may powered or activated by directing electromagnetic energy onto the die 22. If the electromagnetic energy impacting the die 22 exceeds a predetermined first energy level, the circuitry 30 of the die 22 is activated. The predetermined first energy level is the energy level that is sufficient to activate the die 22.

In accordance with one aspect of the apparatus and method described here, one or more conductor loops 42 are formed in the circuitry of the die 22. The conductor loop 42 may be included in the circuitry portion 30 of the die. The conductor loop 42 forms an inductor when a changing electromagnetic energy passes over the conductor loop 42, so that a voltage is generated in the conductor loop.

As will be recognized and understood by those skilled in the art, a moving electrical charge (a current) generates a magnetic field. A moving magnetic field generates an electric field having a voltage, which can give rise to an electrical current. This pair of phenomena allows radiated electromagnetic energy that impacts or passes through the conductor loop 42 to generate a current in the conductor loop 42.

If the electromagnetic energy passing through the conductor loop 42 exceeds a predetermined first energy level, sufficient voltage is generated in the conductor loop 42 to power or activate the circuitry 30, or at least a particular portion of the circuitry 30 that is of interest.

Figure 3:
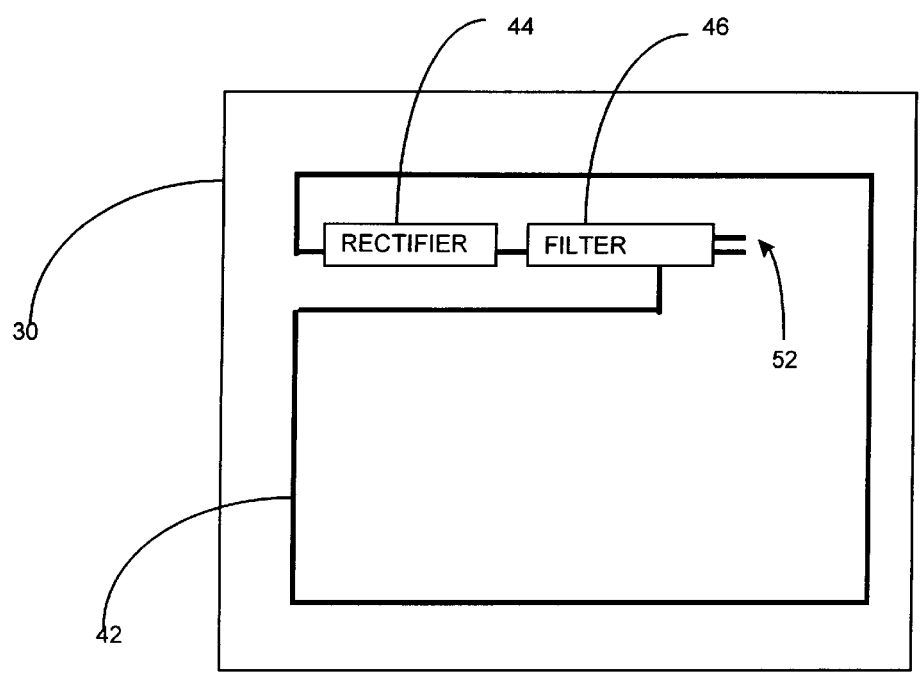
FIG. 3 is a diagrammatic representation of a portion of the circuitry of the die shown in FIG. 2.

As shown in FIG. 3, the circuitry that includes the conductor loop 42 additionally includes a rectifier 44 and a filter 46 to provide the electrical power to energize the remainder of the circuitry 30 on the die 22. Electromagnetic energy passing through the conductor loop 42 generates a voltage at the output 52 of the filter 46 that may be used to drive the remainder of the circuitry 30.

Figure 4:
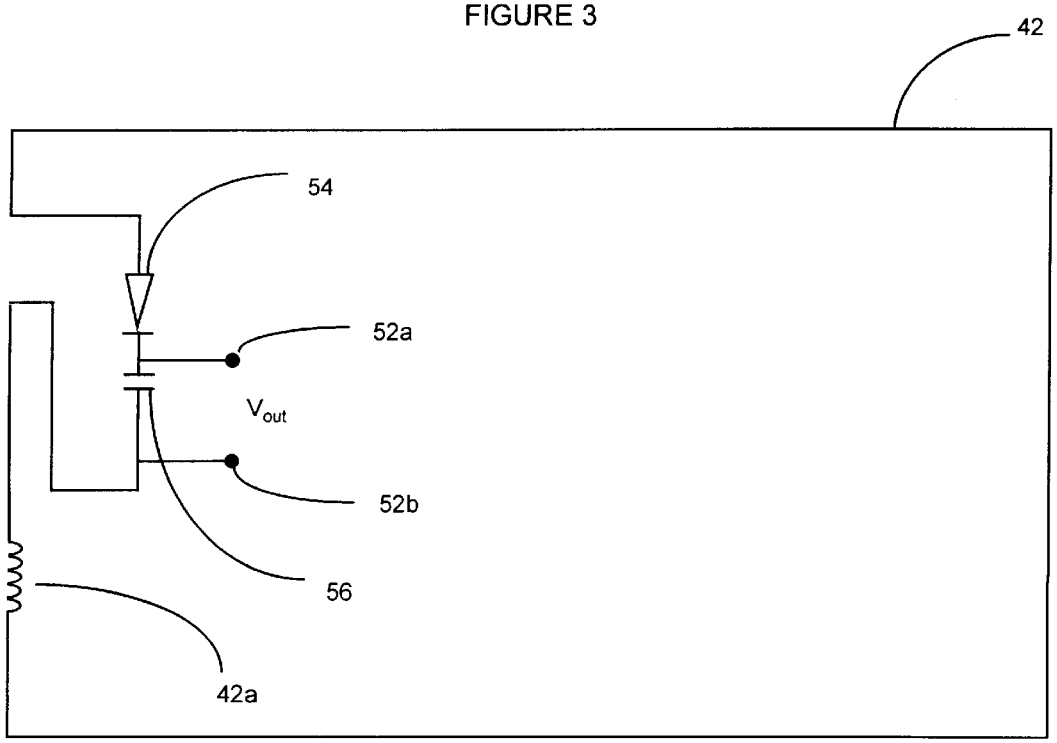
FIG. 4 is a schematic diagram of a portion of the circuitry of the die shown in FIG. 2.

A very simple rectifier and filter structure is shown in FIG. 4. The rectifier and filter circuit includes a diode 54 and a capacitor 56. Output terminals 52a, 52b are connected across the capacitor 56. The inductance of the loop 42 is indicated schematically at 42a.

Figure 5:
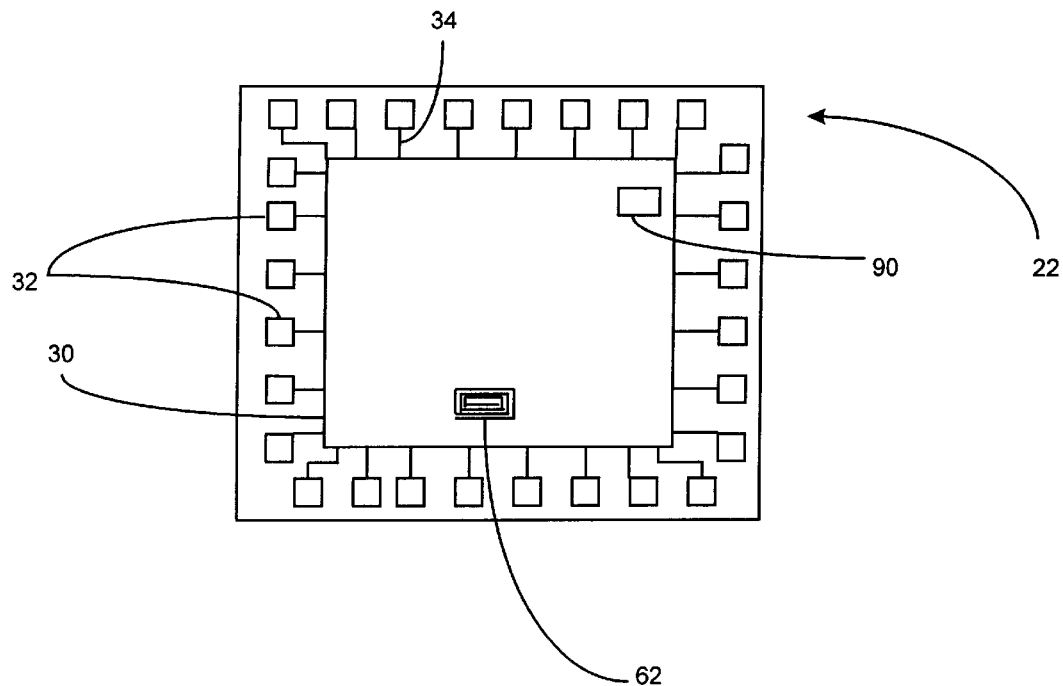
FIG. 5 is a representation of the layout of an alternative embodiment of an individual die of the wafer shown in FIG. 1.
Figure 6:
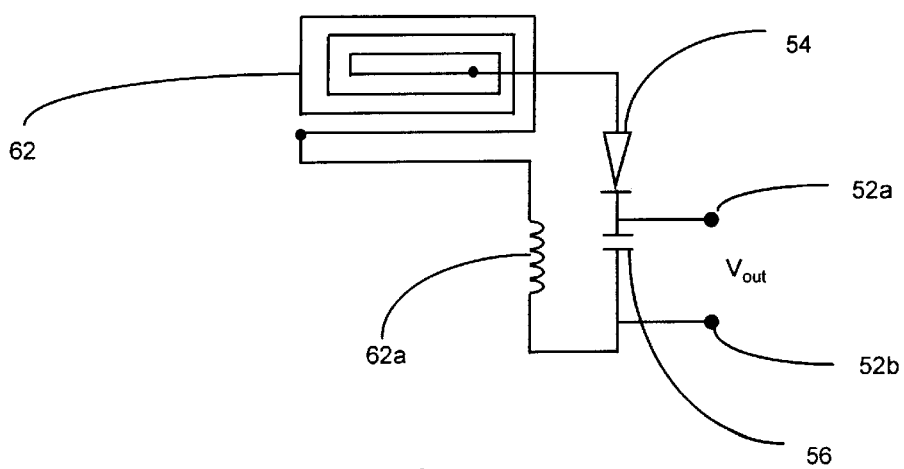
FIG. 6 is a diagrammatic representation of a portion of the circuitry of the die shown in FIG. 5.

An alternative arrangement of the conductor loop is shown in FIG. 5. In lieu of a single conductor loop extending around a substantial portion of the circuitry 30, a spiral loop 62 is included in a portion of the circuitry 30. The spiral loop 62 may be formed as a continuous conductor on a single layer of the die 22. Referring to FIG. 6, a simple rectifier 54 and filter 56 are shown coupled to the spiral loop 62. The rectifier and filter shown in FIG. 6 are the same as those shown in FIG. 4. The inductance of the spiral loop 62 is indicated schematically at 62a.

Those skilled in the art will recognize that as the changing electromagnetic field passes over the spiral conductor 62, a voltage is created between the ends of the spiral conductor 62. The voltage created between the ends of the spiral conductor 62 is proportional to the number of turns in the spiral 62. The voltage created in the spiral 62 causes a current to flow through the diode 54 and the capacitor 56, which in turn produces a voltage at the output terminals 52a, 52b. The voltage at the output terminals 52a, 52b may then be used to drive the remainder of the circuitry 30. Particular requirements may require that a greater or lesser number of turns be included in the spiral conductor 62.

Figure 7:
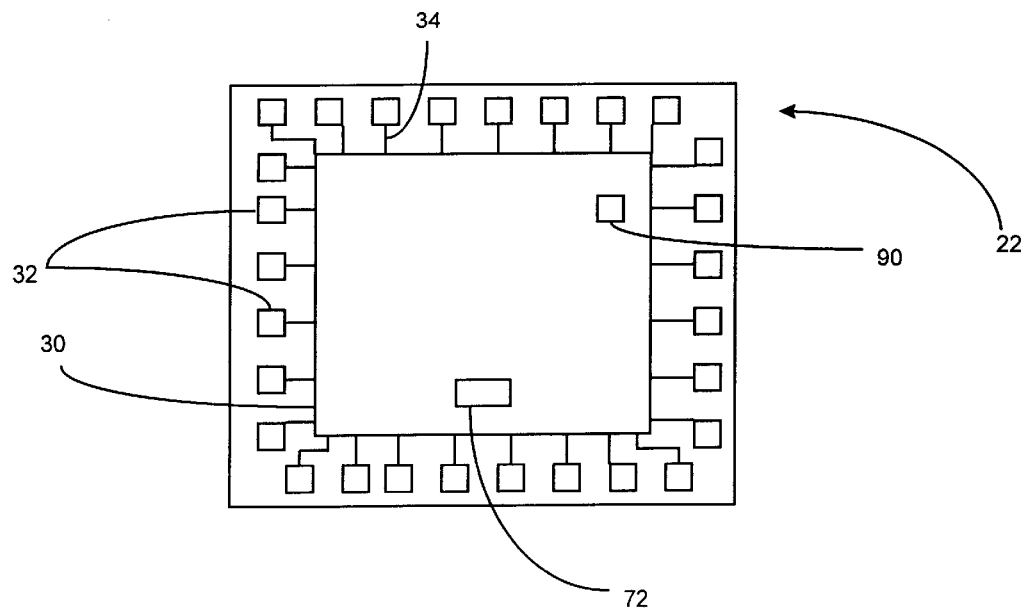
FIG. 7 is a representation of the layout of another embodiment of an individual die of the wafer shown in FIG. 1.
Figure 8:
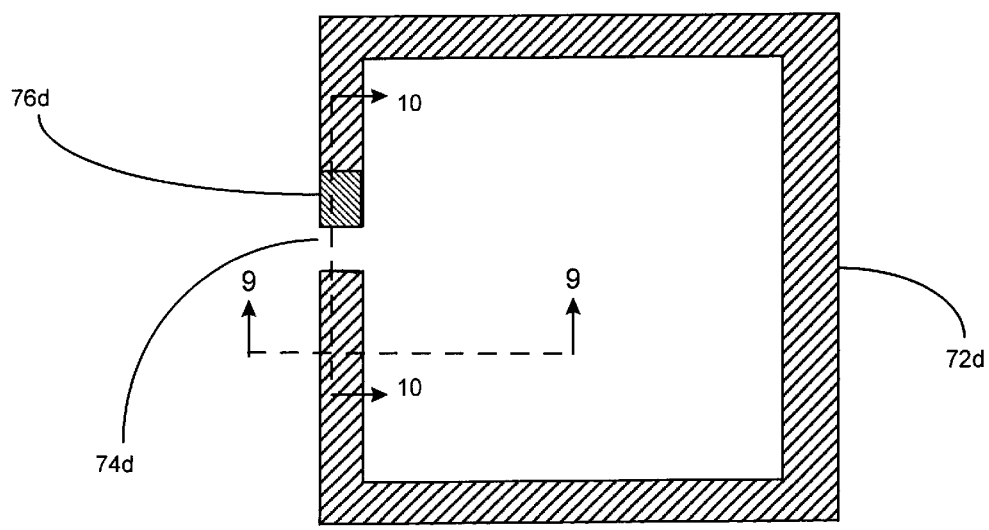
FIG. 8 is an enlarged plan view of a portion of the layout of the die shown in FIG. 7.

Yet another embodiment or arrangement for the conductor loop is shown in FIGS. 7, 8, 9, and 10. The conductor loop 72 shown in FIG. 7 is a multi-layer conductor spiral. The conductor loop 72 is formed of several layers of individual loop layers 72a–d (see FIGS. 9 and 10). The top conductor loop layer 72d is shown in FIG. 8 as representative of the individual loop layers. Referring now to FIG. 8, the top conductor loop layer 72d is not quite a complete loop. The top conductor loop layer 72d has a gap 74 between the ends of the conductor of the loop layer 72d. The first, second, and third conductor loop layers 72a, 72b, 72c are similar to the top conductor loop layer 72d shown in FIG. 8. Thus, each conductor loop layer 72a, 72b, 72c, 72d forms almost one complete turn of the vertical conductor spiral.

Figure 9:
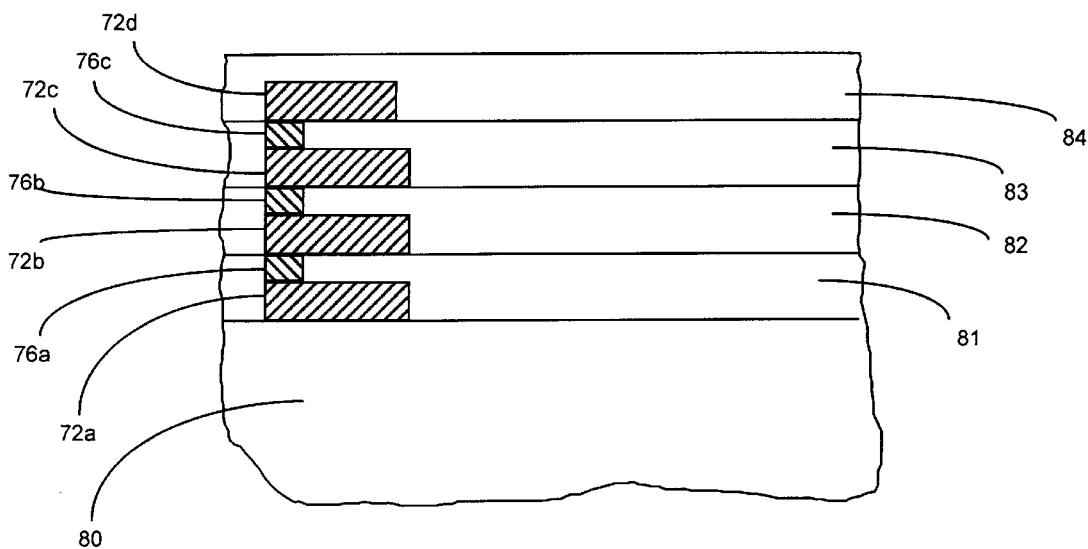
FIG. 9 is a cross sectional view taken along line 9—9 of FIG. 8.

Referring to the cross-sectional view of FIG. 9, the spiral loop 72 includes several conductor loop layers 72a, 72b, 72c, 72d. Each conductor loop layer 72a, 72b, 72c, 72d is formed in a corresponding layer 81, 82, 83, 84 of the semiconductor device, which is fabricated on a substrate 80. The layers 81–84 are the layers in which the electronic circuitry 30 are formed on the die 22.

Figure 10:
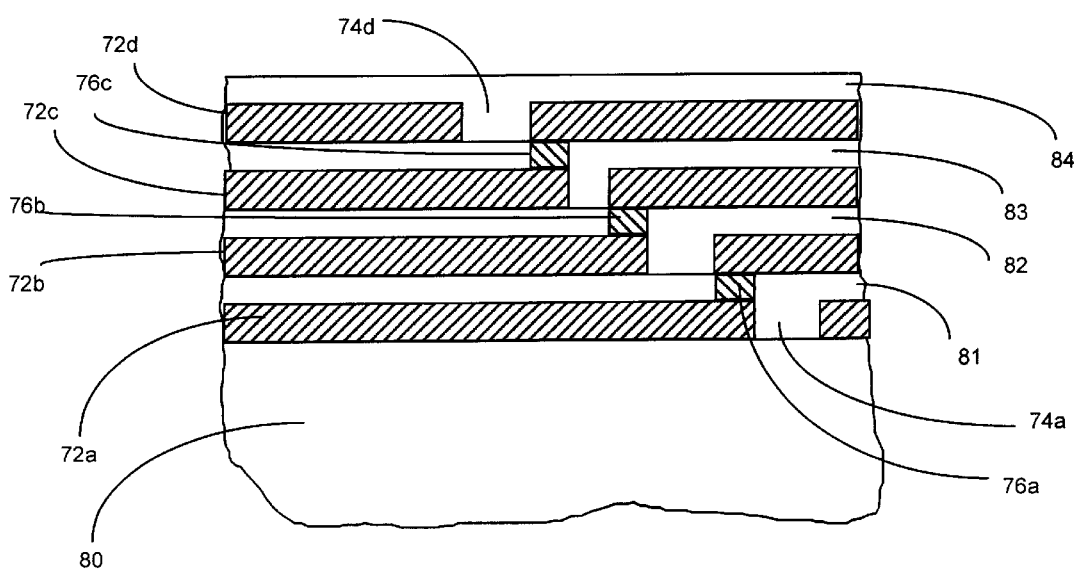
FIG. 10 is a cross sectional view taken along line 10—10 of FIG. 8.

Inter-layer connectors 76a, 76b, 76c provide electrical conductivity between the conductor loop layers 72a, 72b, 72c, 72d. A first inter-layer connector 76a provides electrical conductivity between the conductor loop portion 72a of the first layer 81 and the conductor loop portion 72b of the second layer 82. As seen in FIGS. 9 and 10, additional inter-layer connectors 76b, 76c provide electrical conductivity between the conductor loop portions 72b, 72c, 72d of the second, third, and fourth layers 82, 83, 84 of the die 22. The top interlayer connector 76c connects the top loop layer 72d to the loop layer underneath it. Although shown in the view of FIG. 8 to aid in understanding the structure, the interlayer connector 76c is actually beneath the top loop layer 72d, as is shown in FIGS. 9 and 10.

The conductor loop layers 72a, 72b, 72c, and 72d are arranged above one another in the layers 81–84 so that together they form a vertical spiral of conductive material through the layers 81–84 of the semiconductor die 22. The gaps in each conductor layer are staggered, as shown in FIG. 10, so that the conductor layers 72a–72d form a spiral. A rectifier and filter such as that shown in FIGS. 4 and 6 may be coupled between the two ends of the multi-layer spiral conductor loop.

As is recognized by those skilled in the art, when electromagnetic energy or radiation impacts the vertical spiral conductor 72, a voltage is created between the two ends of the conductor spiral. This voltage is proportional to the number of turns in the conductor spiral loop 72. The voltage created between the two ends of the conductor spiral loop 72 creates a current that may be used to drive be circuitry 30.

As shown in FIGS. 2, 5, and 7, the circuitry 30 on the die 22 additionally includes an electromagnetic transmitter or radiating element 90. The radiating element 90 provides a wireless response signal when the circuitry 30 of the die 22 is activated. The response signal emitted by the radiating element 90 indicates the status of the die 22. The circuitry 30 of the die 22 is designed so that when the die is activated, the radiating element 90 emits an electromagnetic signal representative of the status of the die 22. As described above, the die 22 may be activated by electromagnetic energy passing over the conductor loop 42 (FIG. 2), 62 (FIG. 5), or 72 (FIG. 7).

Figure 11:
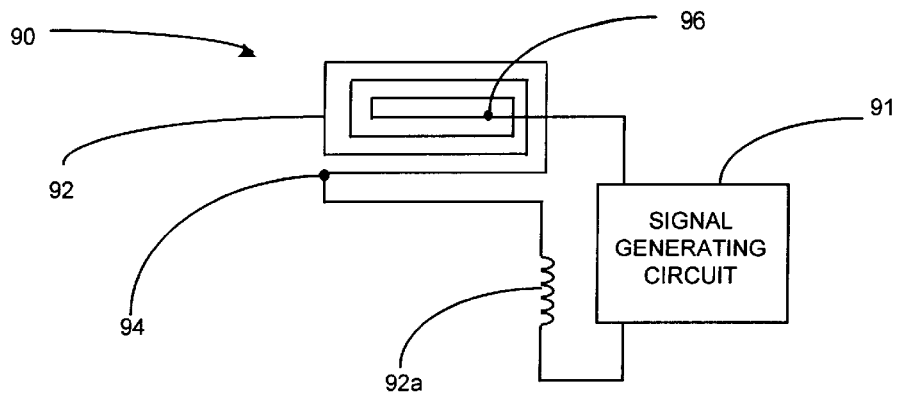
FIG. 11 is a diagrammatic representation of a portion of one embodiment of the radio-frequency radiating element portion of the circuitry of the die shown in FIGS. 2, 5, and 7.

The electromagnetic radiating element 90 may include a second conductor loop through which the circuitry 30 may direct a current when the die 22 is activated. The conductor loop of the electromagnetic radiating element 90 may be a spiral loop 92 (FIG. 11). When the circuitry 30 is activated by a current flowing through the first, activation conductor loop 42 (FIG. 2), 62 (FIG. 5), or 72 (FIG. 7), a signal generating circuit 91 in the circuitry 30 causes a voltage to be applied across the terminals 94, 96 of the radiating element conductor loop 92, and a current to flow through the radiating element conductor loop 92. That current creates a magnetic field that radiates from the die 22 because of the inductance in the spiral loop 92. That inductance is indicated at 92a.

In certain applications, it may be possible for the activation conductor loop 42 (FIG. 2) and, 62 (FIG. 5), or 72 (FIG. 7) to also serve as the radiating element 90. Those skilled in the art will recognize that in such a circumstance, additional components are required to provide the RF choke action to keep the output signal energy from the rectifier 44 (FIGS. 3 and 4).

Figure 12A:
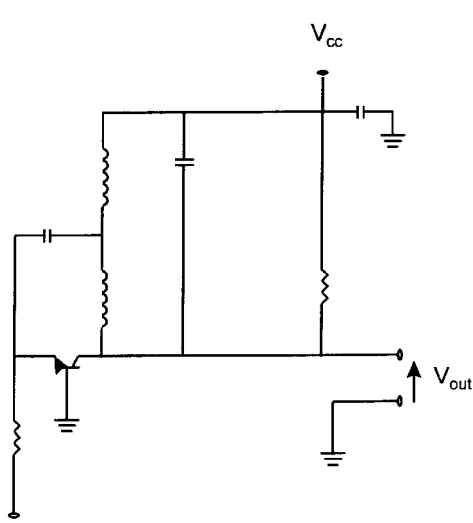
FIGS. 12a and 12b are schematic diagrams of alternative embodiments of the radiating element portions of the circuitry of the die shown in FIGS. 2, 5, and 7.
Figure 12B:
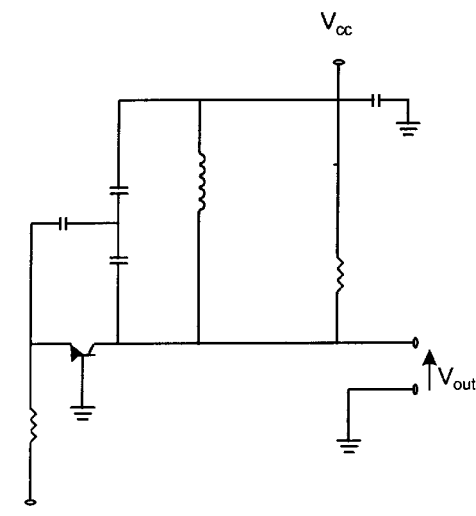

In certain applications, more sophisticated information may be transmitted by the radiating element 90. Information may be encoded onto electromagnetic radiation that is wirelessly transmitted by the radiating element 90. For example, the radiating element 90 may include a transmitting oscillator circuit for modulating the information onto a radio-frequency (RF) carrier. An NPN Hartley oscillator as shown in FIG. 12a may be used for this purpose. Alternatively, an NPN Colpitts oscillator as shown in FIG. 12b may be used. The Hartley and Colpitts oscillators, as well as other oscillators that may also be incorporated in the radiating element 90, are well understood in the art.

The oscillator of the radiating element 90 allows electrical information in the circuitry 30 to be modulated onto a radio-frequency (RF) carrier wave. The modulation may be frequency modulation or spread spectrum encoding.

Those skilled in the art will recognize that other methods of wirelessly transmitting information may be used in the radiating element 90. For example, infrared radiation may be used to carry the information. An on-chip infrared generator (not shown) in the radiating element 90 may be used to encode information onto an infrared beam. Yet further embodiments may incorporate one or more on-chip lasers (not shown) to transmit information. The information is modulated or encoded onto a beam of coherent optical radiation (light) emitted by the on chip laser.

Figure 13:
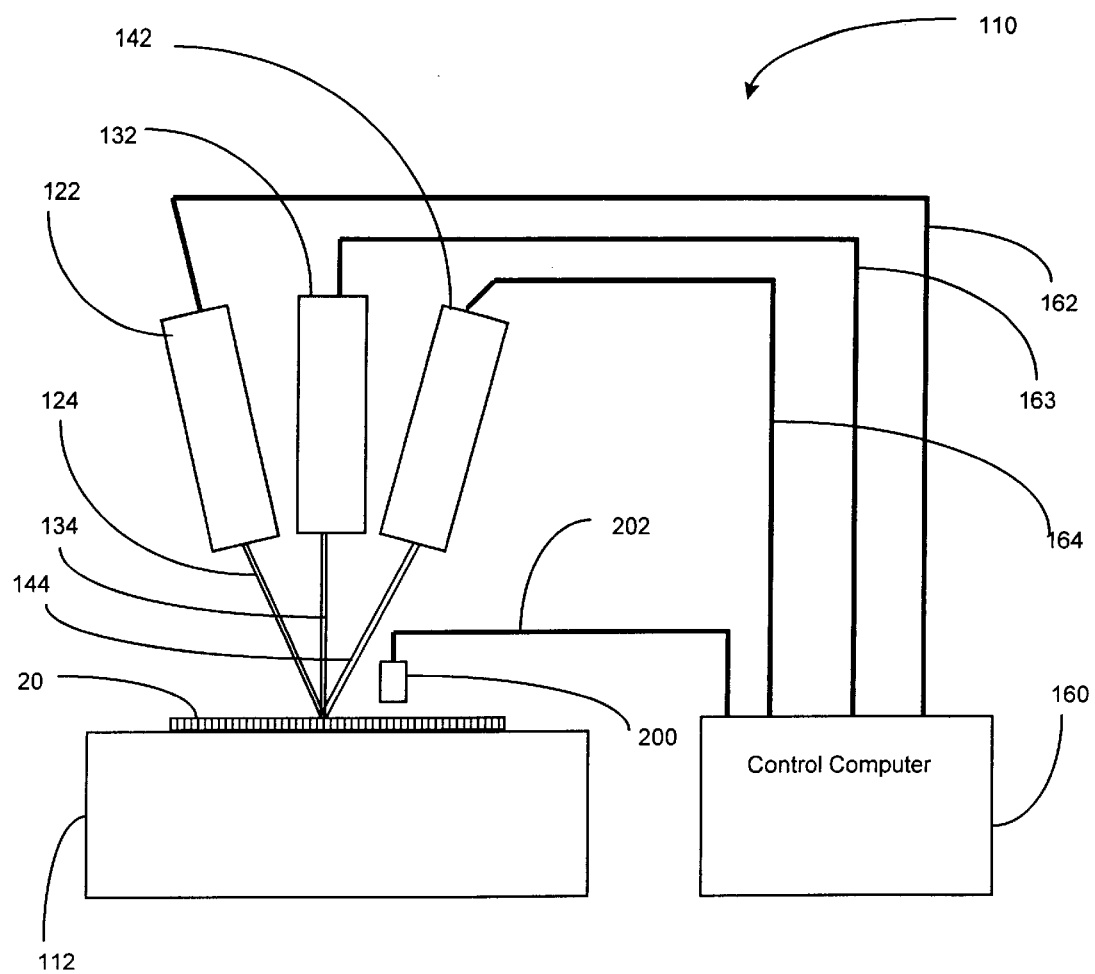
FIG. 13 illustrates a test apparatus constructed in accordance with the present invention and for use in accordance with the method of the present invention.

Referring now to FIG. 13, a test apparatus 110 incorporating the present invention is shown. The test apparatus 110 includes a test bed 112 or other wafer support structure for supporting the wafer 20 containing the die 22 that are to be tested.

The test system 110 includes three sources of electromagnetic energy 122, 132, 142. Each of the electromagnetic energy sources 122, 132, 142 produces a narrow beam 124, 134, 144 of electromagnetic energy. The sources 122, 132, 142 direct those beams 124, 134, 144 toward the selected die 22 on the wafer 20 mounted on the test bed 112. Thus, the beams 124, 134, 144 converge on the selected die 22.

As described above, the die 22 may be activated by directing electromagnetic energy over the conductor loop 42 (FIG. 2), 62 (FIG. 5), or 72 (FIG. 7). The die 22 is activated when the energy passing over or impacting the conductor loop 42, 62, or 72 exceeds a predetermined activation level.

A challenge to wirelessly activating the die 22 using beams of electromagnetic energy is to activate only one die at a time, so that each die may be individually tested.

Each die on the wafer may be provided with an individual address. The beams of electromagnetic energy may include coding related to those addresses. However, manufacturing individual addresses into each die on the wafer would require that different masks be used for each die on the wafer. Since semiconductor wafers are currently manufactured using identical masks for all the die on wafer, using different masks for each die on the wafer would substantially complicate the manufacturing process.

In many instances, it is difficult to accurately focus a single beam of electromagnetic energy so that it would activate only one die at a time.

In accordance with an aspect of the present invention, no one of the electromagnetic beams 124, 134, 144 individually couples or delivers sufficient energy to the selected die 22 to activate that die. The energy of at least two beams is required to activate the die. Preferably, all three beams are required to overlap at least partially to couple sufficient to energy to the die 22 to activate that die.

In particular, the first electromagnetic energy source 122 produces a first beam of electromagnetic energy 124 directed toward the portion of the selected die 22 containing the conductive loop 42 (FIG. 2), 62 (FIG. 5), or 72 (FIG. 7). The first beam of electromagnetic energy 124 does not provide sufficient energy to the conductor loop 42, 62, or 72 to cause sufficient current to flow through the conductor loop 42, 62, or 72 to activate the circuitry 30 of the die 22.

The second electromagnetic energy source 132 produces a second beam of electromagnetic energy 134, which is directed toward the same portion of the selected die 22 to which the first beam 124 was directed. The second beam of electromagnetic energy 134 also does not itself provide sufficient energy to the conductor loop 42, 62, or 72 to cause enough current to flow to activate the circuitry 30. The second electromagnetic energy source 132 directs the second electromagnetic beam 134 so that as much as possible the second electromagnetic beam 134 overlaps the first electromagnetic beam 132. The second electromagnetic beam 134 is in phase with the first electromagnetic beam 132 at the point at which the beams 124, 134 impact the conductor loop 42, 62, or 72, so that the energies of the two electromagnetic beams 132, 134 are mutually in phase and reinforce each other.

In certain instances, the two electromagnetic beams 124, 134 may together couple sufficient energy to the conductor loop 42, 62, or 72 to at least equal the energy required to activate the circuitry 30 by causing sufficient current to flow in the conductor loop 42, 62, or 72 to activate the circuitry 30. In those circumstances, the two beams 124, 134 may be focused with sufficient precision that the region of overlap between the two beams on the die 22 is sufficiently precise that the apparatus can ensure only one die at a time is activated.

The third electromagnetic energy source 144 produces a third beam of electromagnetic energy 144, which is also directed toward the same portion of the selected die 22 to which the first and second electromagnetic beams 132, 134 are directed. Thus, to the extent possible, the three beams of electromagnetic energy 124, 134, 144 are directed to overlap at least partially on the die 22 at the point at which the conductor loop 42, 62, or 72 is located. The third beam of electromagnetic energy 144 also does not itself supply to the conductor loop 42, 62, or 72 sufficient energy to cause sufficient current to flow through that conductor loop to activate the circuitry 30. The third beam 144 is in phase with the first and second beams 124, 134 at the conductor loop 42, 62, or 72 so that the third beam 144 reinforces the first and second beams 124, 134.

Figure 14:
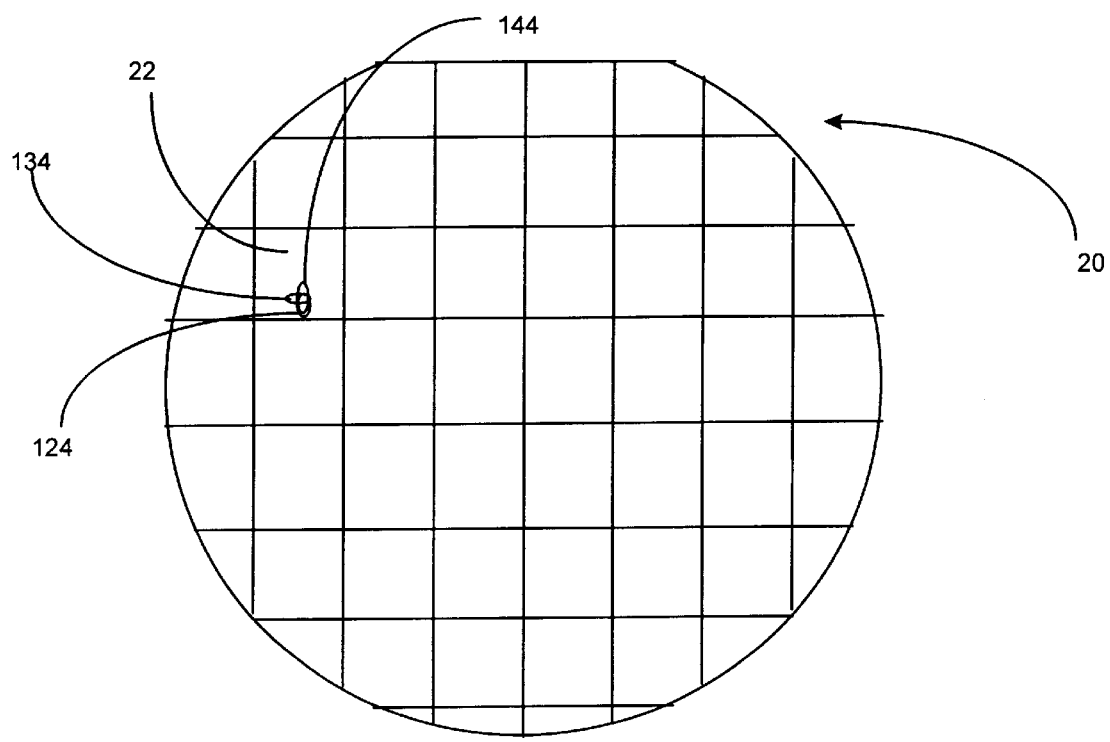
FIG. 14 shows a wafer of individual integrated circuits with the overlapping beams of electromagnetic energy applied by the apparatus of FIG. 13.

FIG. 14 illustrates the three beams 124, 134, 144 overlapping on the die 22 of the wafer 20. The combined energy of the three beams 124, 134, 144 at the conductor loop 42, 62, or 72 is sufficient to cause a current to flow through the conductor loop to activate the circuitry 30 for testing.

Using multiple beams, each of which individually does not have sufficient energy to excite a particular die, allows the beams to be adjusted so that they overlap only on the selected die. Using three beams allows a greater degree of precision in creating the area of beam overlap on the die 22.

The electromagnetic energy sources 122, 132, 142 are controlled by a control computer 160 (FIG. 13). The control computer 160 may be a programmed general-purpose computer. Control lines 162, 163, 164 connect the control computer 160 to the electromagnetic energy sources 122, 132, 142, respectively.

The control signals supplied by the control computer 160 to the electromagnetic energy sources 122, 132, 142 cause the electromagnetic energy sources to focus their beams of electromagnetic energy 124, 134, 144 to overlap on the exact portion of the circuitry 30 on the die 22 containing the conductor loop 42 (FIG. 2), the spiral conductor 62 (FIG. 6), or the multi-layer, spiral conductor 72 (FIGS. 7–10).

The control signals supplied by the control computer 160 to the energy sources 122, 132, 142 also control the phase of the energy beams 124, 134, 144. As noted above, it is desirable for the electromagnetic beams 124, 134, 144 to be mutually in phase at the point at which the beams 124, 134, 144 impact the conductor loops 42, 62, or 72, so that the energies of the three beams 124, 134, 144 reinforce each other.

The electromagnetic energy sources 122, 132, 142 may include modulated electron guns, lasers, microwave generators, or radio frequency signal generators.

Figure 15:
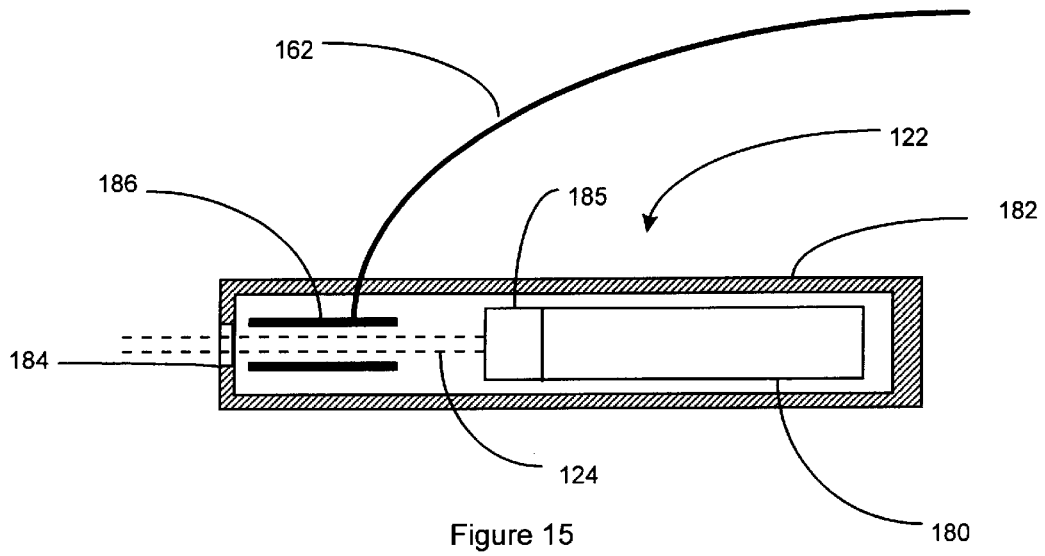
FIG. 15 is a simplified diagram, partially in cross-section, of a source of electron beams in accordance with an aspect of an embodiment of the present invention.

An exemplary electromagnetic energy source 122 incorporating an electron gun 180 is shown in FIG. 15. The electron gun 180 is enclosed within a housing 182. An opening 184 in one end of the housing 182 permits passage of the electron beam 124 emitted from the electron gun 180. A set of deflector plates 186 controls the direction of the beam from the electron gun 180.

The electron beam 124 is modulated in intensity at a predetermined modulation frequency by an intensity modulator 185. In this manner, the electron beam 124 behaves as a time varying current. The intensity modulation of an electron beam such as the beam 124 is well known, and commonly used in applications such as cathode ray tubes (CRT's).

The time-varying electron beam 124 sets up a time varying electric field along the beam. This time-varying electric field surrounding the electron beam 124 is so closely associated with the electron beam 124 that it may be thought of as virtually equivalent to the electron beam. For the purposes hereof, then, the time-varying electron beam 124 functions as a beam of electromagnetic energy. Thus, when this time-varying beam impacts the conductor loop 42, 62, or 72, the conductor loop is presented with a time-varying electric field. The frequency and phase of the modulation applied to the electron beam becomes the frequency and phase of the equivalent electromagnetic "beam" propagating with the electron beam 124.

The modulation frequency applied by the modulator 185 to develop the modulated electron beam 124 may be selected from a wide range, depending on the specific needs. For example, a modulation frequency of several Hertz may be chosen.

The direction of the beam 124 may be controlled by electrically charging two sets of deflection plates 186, as is understood by those familiar with the art. The charging of the deflector plates 186 to control the direction of the beam 124 is determined by instructions transmitted by the control computer 160 through the control line 162 (FIG. 13). Controlling the direction of the beam 124 allows the beam to be directed at the selected die 22. The construction and operation of electron guns are well understood in the art. Electron guns are used in CRT's and other applications.

If, to scan the entire wafer 20, the electron beam 124 must be moved through a range of movement greater than can be provided using the deflection plates 186, the entire electromagnetic energy source 122 may be movable. The electromagnetic source 122 may be moved using one or more electric motors (not shown). The electric motors may also be directed by control signals generated by the control computer 160 and directed through the control line 162.

Figure 16:
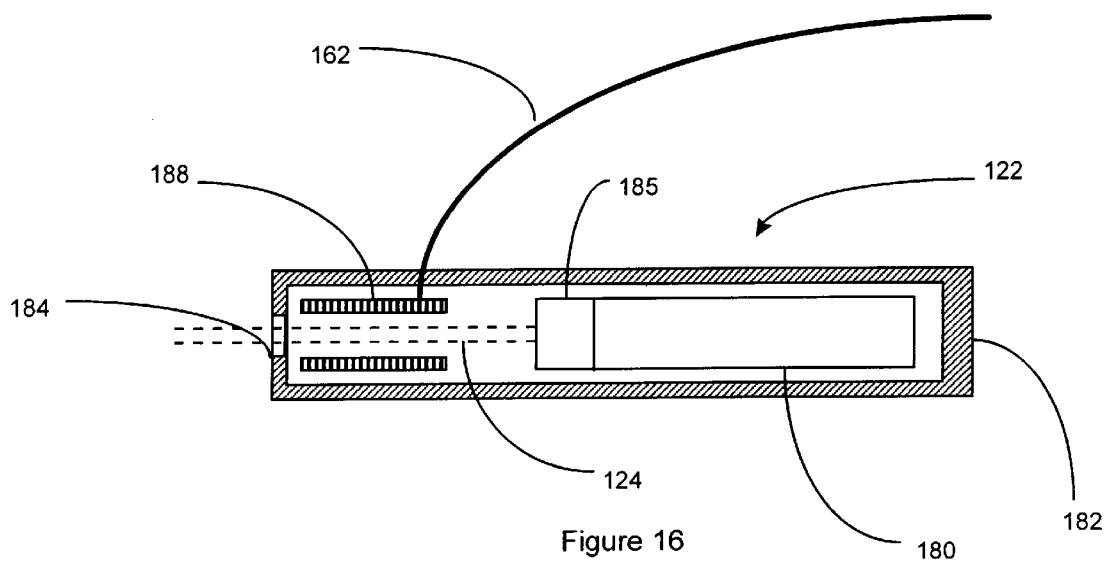
FIG. 16 is a simplified diagram, partially in cross-section, of a source of electron beams in accordance with an aspect of another embodiment of the system incorporating the present invention.

An alternative embodiment for the electromagnetic energy source 122 is shown in FIG. 16. The electromagnetic energy source 122 shown in FIG. 16 also includes an electron gun 180 enclosed in a housing 182. The electron gun 180 modulates the intensity of the electron beam 124. An opening 184 in one end of housing allows passage of the electron beam 124 generated by the electron gun 180. The direction of the beam 124 may be controlled by deflection coils 188. As is understood in the art, controlling the current flowing through the deflection coils 188 creates a magnetic field that adjusts direction of the electron beam 124 passing by those coils 188.

Figure 17:
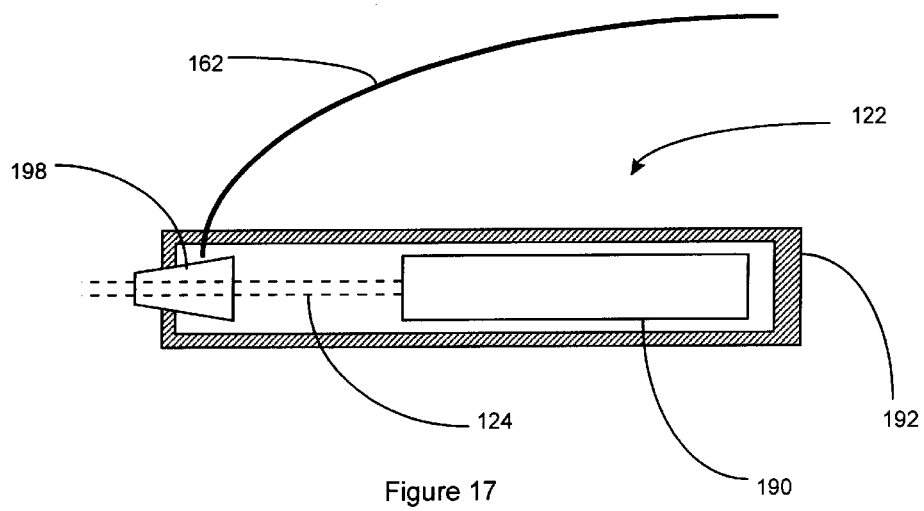
FIG. 17 is a simplified diagram, partially in cross-section, of a source of radio frequency energy in accordance with an aspect of yet another embodiment of the system incorporating the present invention.

Shown in FIG. 17 is yet another embodiment for the electromagnetic energy source 122. A radio-frequency source 190 generates a beam 124 of RF energy. The RF beam is directed by the wave guide 198. Extraneous RF energy may be contained by a housing 192. An opening through the end of housing holds the wave guide 198. A variety of RF sources are available and familiar to those skilled in the art.

Figure 18:
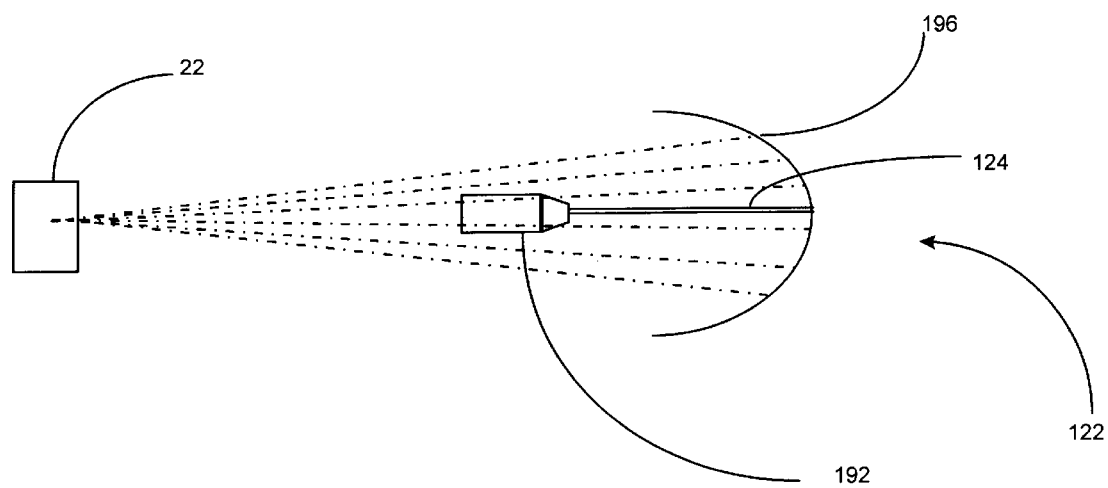
FIG. 18 is simplified diagram of a source of radio frequency energy in accordance with an aspect of yet another embodiment of the system incorporating the present invention.

In certain circumstances it may be difficult to adequately focus the RF beam 124 directly using only the wave guide 198. In such circumstances, the beam 124 emerging from the wave guide 198 may be reflected on a concave mirror or reflector 196, as shown in FIG. 18. The concave reflector 196 is shaped to focus RF energy emerging from the wave guide 198 at a particular focal point. Adjusting the position and direction of the reflector 196 allows that focal point of the reflector 196 to be positioned at the proper place on the die 22.

The test apparatus 110 of FIG. 13 selectively activates each individual die 22 on the wafer 20. The control computer 160 causes the electromagnetic energy sources 122, 132, 142 to selectively direct or focus their beams 124, 134, 144 on particular die of the wafer.

In accordance with the invention, a probe does not need to physically contact the die to individually activate the die. The die are activated wirelessly by directing the electromagnetic beams 124, 134, 144 to the selected die. Many die on the wafer may be rapidly tested in succession. Unlike prior testing apparatus, a probe does not need to be physically moved from die to die. The electromagnetic beams 124, 134, 144 of the test apparatus 110 may be rapidly moved to focus on different die. When the electromagnetic beams 124, 134, 144 are electron beams, movement of the beams 124, 134, 144 may require only changing the charge on the deflector plates 186 or the current in the deflector coils 188.

The test apparatus 110 may be used to test many different die designs with minimal changes to the test apparatus 110. New probes do not need to be designed for each new die design. A different die design may be activated for testing by simply changing the pattern followed by the electromagnetic energy beams 124, 134, 144. The pattern followed by the electromagnetic energy beams 124, 134, 144 may be changed by changing the control signals to the electromagnetic energy sources 122, 132, 142. Therefore, a change in the pattern followed by the electromagnetic energy beams 124, 134, 144 may be implemented by simply changing the programming of the control computer 160.

Because different physical probes do not need to be attached to the tester 110 when a new die design is to be tested, the tester 110 may be rapidly changed to test different die designs.

Referring again to FIG. 13, a wireless test probe 200 in the test apparatus 110 detects the response signal emitted by the radiating element 90 of the die 22. For example, the wireless test probe 200 may detect the magnetic field created by the current flowing through the second conductor loop 92 of the radiating element 90.

The test probe 200 may be placed near the wafer 20 when the wafer 20 is mounted on the test bed 112. The signals detected by the probe 200 are directed from the probe 200 to the control computer 160 through a probe connection 202. The control computer 160 analyzes the signals received by the probe 200. This analysis can be helpful in determining that the circuitry 30 of the die 22 is operating appropriately when the die is activated. The specific analysis procedure performed by the control computer depends on the particular feature to be analyzed. Those familiar with the testing microelectronic circuitry are familiar with such analysis programs.

Figure 19:
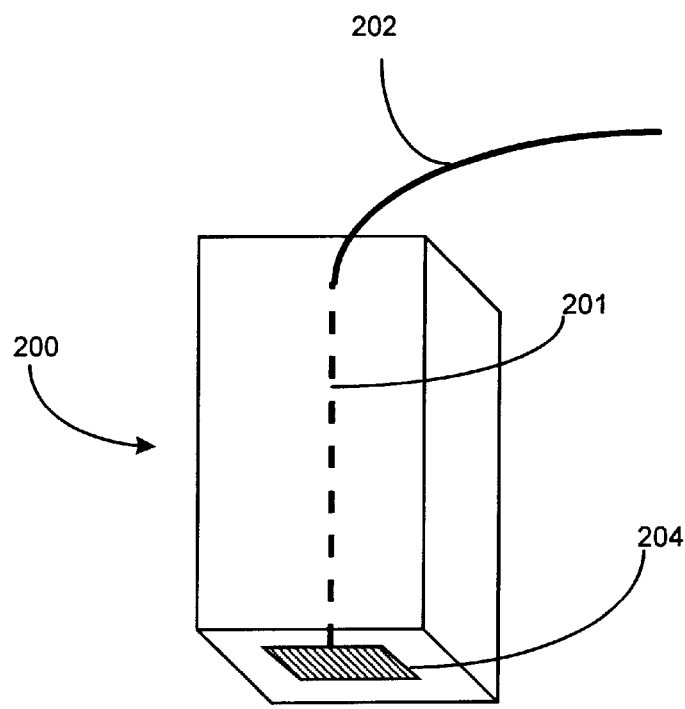
FIG. 19 is a perspective view of a test apparatus probe incorporating an aspect of the present invention.

Referring now to FIG. 19, the test probe 200 includes an electromagnetic receiver 204. The electromagnetic receiver 204 may be included on the bottom of the test probe 200 so that the receiver 204 may be brought into close proximity with the wafer 20. A probe conductor 201 conducts the detected signal from the receiver 204 to the probe connection 202.

In a simplified embodiment, those skilled in the art will recognize that electrical currents in the radiating element 90 may be inductively coupled to the receiver 204. Similarly, voltages in the radiating element 90 may be capacitively coupled to the receiver 204.

These electrical principles permit information to be transferred from the radiating element 90 (FIG. 11) to the test probe 200 wirelessly. Such wireless communication of information from the radiating element 90 eliminates the need to physically contact the die 22 of the wafer 20 to determine if the die is operating properly upon being activated by the electromagnetic beams 124, 134, 144.

The receiver 204 may include a simple detector comprising a conductor loop similar to the conductor loops 42, 62, or 72. Such conductor loops detect radiation emitted from an radiating element such as the conductor loop 92 shown in FIG. 11.

When the radiating element 90 of the die 22 includes an RF transmitter, the receiver 204 on the test probe 200 detects the RF signal emitted by the radiating element 90. The receiver 204 demodulates or decodes the information from the detected RF signal.

Figure 20:
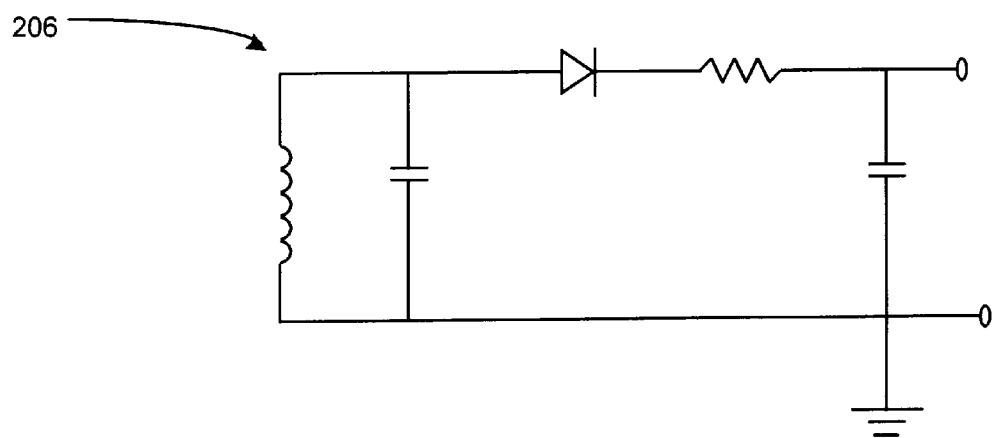
FIG. 20 is a schematic diagram of a receiver incorporated in the test probe shown in FIG. 19.

The receiver 204 may include a simple detector/demodulator 206 (FIG. 20) for receiving RF signals from the radiating element 90 of the die 22. The detector/demodulator 206 of the receiver 204 is tuned to the frequency of the oscillator of the radiating element 90 of the die 22. The detector/demodulator 206 shown in FIG. 20 and other detector/demodulators are also well understood by those skilled in the art.

How closely the receiver 204 of the probe 200 must be placed to particular die 22 of the wafer 20 is a function of the distance over which the receiver 204 may accurately detect and decode signals transmitted by the radiating element 90. The probe 200 preferably may be placed close enough to the die 20 so that the receiver 204 detects the radiation emitted by the radiating element 90 without antenna or amplification devices.

For the receiver 204 of the test probe 200 to accurately receive radio frequency signals emitted by the radiating element 90, the test probe 200 may be positioned so that the receiver 204 is within 10 cm of the die 22. Preferably, the receiver 204 of the test probe 200 is placed within three cm of the die 22.

The wireless test probe 200 enhances the wireless testability of the die 22 of the wafer 20. Physical contact with the die 22 is not required to detect the test response signals emitted by the radiating element 90 of the die 22. The control computer 160 may control the movement of the probe 200 so that it follows the activation beams 124, 134, 144 over the wafer 20.

Wireless receipt of the test response signals from the die 22 allows the individual die 22 of a wafer 20 to be tested quickly. In addition, the pattern followed by the test probe 200 may be changed by changing the programming of the control computer 160. No changes to the hardware of the test apparatus 110 are required to test different die designs. This lack of hardware changes allows the test apparatus 110 to be quickly adapted to test a variety of different die designs.

Having been provided with the above description, those having skill in the art will be able to design a variety of specific embodiments and implementations to the invention. For example, other forms of generating beams of electromagnetic energy may be developed. In addition, a variety of the implementations are possible for activating the circuitry on the particular die to which the electromagnetic energy is directed. Furthermore, various implementations for controlling the electromagnetic energy sources will be apparent to those skilled in the art. Therefore, the above description is intended to be exemplary, and not limiting.

We claim:

1. A method of wirelessly activating a selected die on a wafer having a plurality of die, wherein said selected die is activated by being impacted by electromagnetic energy having at least a first energy level, the method comprising:

directing a first beam of electromagnetic energy toward said selected die, wherein said first beam of electromagnetic energy impacts said selected die with less than said first energy level;

directing a second beam of electromagnetic energy toward said selected die, wherein said second beam of electromagnetic energy impacts said selected die with less than said first energy level; and directing said first and second beams of electromagnetic energy so that said first and second beams of electromagnetic energy at least partially overlap on said selected die, wherein said first and second beams together impact said first die with an energy level at least equal to said first energy level.

2. The method of claim 1, wherein said steps of directing said first and second beams of electromagnetic energy comprise directing said first and second beams of electromagnetic energy to a conductive loop on said selected die so that a current is generated in said conductive loop.

3. The method of claim 1, further comprising the steps of:

providing a first electron beam, wherein said first electron beam is modulated at a predetermined frequency by a first intensity modulator such that a time-varying electric field surrounds said electron beam; and providing a second electron beam wherein said second electron beam is modulated at a predetermined frequency by a second intensity modulator such that a time-varying electric field surrounds said electron beam; wherein said first and second beams of the electromagnetic energy comprise the first and second electron beams.

4. The method of claim 3, wherein said steps of directing said first and second beams of electromagnetic energy comprise directing said first and second electron beams with electrically charged deflection plates.

5. The method of claim 1, wherein said selected die radiates an electromagnetic signal when it is activated by being impacted by electromagnetic radiation having an energy level at least equal to said first energy level, and wherein said method additionally comprises detecting said radiated electromagnetic signal.

6. The method of claim 1, wherein said first and second beams of electromagnetic energy are mutually coherent at the point at which they contact the die.

* * * * *